United States Patent [19]
Hashimoto

[11] Patent Number: 5,717,254
[45] Date of Patent: Feb. 10, 1998

[54] SEMICONDUCTOR DEVICE INCLUDING A PLURALITY OF TRANSISTORS

[75] Inventor: Koichi Hashimoto, Kawasaki, Japan

[73] Assignee: Fujitsu Limited, Kawasaki, Japan

[21] Appl. No.: 305,280

[22] Filed: Sep. 13, 1994

[30] Foreign Application Priority Data

Sep. 20, 1993 [JP] Japan .................. 5-256386

[51] Int. Cl.$^6$ .................. H01L 23/48; H01L 23/52
[52] U.S. Cl. .................. 257/773; 257/288; 257/365; 257/770
[58] Field of Search .................. 257/770, 773, 257/288, 356, 365

[56] References Cited

U.S. PATENT DOCUMENTS

| | | | |
|---|---|---|---|
| 4,384,301 | 5/1983 | Tasch, Jr. et al. | 357/23 |
| 4,545,116 | 10/1985 | Lau | 29/591 |
| 4,657,628 | 4/1987 | Holloway et al. | 156/643 |
| 4,675,073 | 6/1987 | Douglas | 156/643 |
| 4,746,219 | 5/1988 | Holloway et al. | 357/23.11 |
| 4,793,896 | 12/1988 | Douglas | 156/643 |
| 4,804,636 | 2/1989 | Groover, III et al. | 437/52 |
| 4,821,085 | 4/1989 | Haken et al. | 357/67 |
| 4,863,559 | 9/1989 | Douglas | 156/643 |
| 4,890,141 | 12/1989 | Tang et al. | 357/23.3 |
| 4,957,590 | 9/1990 | Douglas | 156/643 |
| 4,975,756 | 12/1990 | Haken et al. | 357/4.1 |
| 4,980,020 | 12/1990 | Douglas | 156/643 |
| 5,010,032 | 4/1991 | Tang et al. | 437/57 |
| 5,122,225 | 6/1992 | Douglas | 156/643 |
| 5,190,893 | 3/1993 | Jones, Jr. et al. | 437/192 |
| 5,381,040 | 1/1995 | Sun et al. | 257/770 |
| 5,414,302 | 5/1995 | Shin et al. | 257/770 |
| 5,418,179 | 5/1995 | Hotta | 257/770 |

FOREIGN PATENT DOCUMENTS

| | | |
|---|---|---|
| 0 190 070A2 | 8/1986 | European Pat. Off. . |
| 0 200 603A2 | 11/1986 | European Pat. Off. . |
| 0 490 877A3 | 6/1992 | European Pat. Off. . |
| 59-121868 | 7/1984 | Japan . |
| 4-63435 | 2/1992 | Japan . |

OTHER PUBLICATIONS

8093 IEEE Transactions on Electron Devices, vol. 39, No. 10, Oct. 1992, New York, US, pp. 2359–2363.
IEDM, 1991, "Enhanced Performance of Accumulation Mode", Wang et al, pp. 679–682.
IEEE Transactions on Electron Devices, vol. 38, No. 4, Apr. 1991, New York, U.S., pp. 876–886.

*Primary Examiner*—Tom Thomas
*Assistant Examiner*—David Ostrowski
*Attorney, Agent, or Firm*—Nikaido, Marmelstein, Murray & Oram LLP

[57] ABSTRACT

A semiconductor device of the present invention includes an insulating layer covering a plurality of semiconductor elements formed in a semiconductor layer, an opening portion formed in the insulating layer respective conductive porions of the plurality of semiconductor elements in the insulating layer, and a conductive pattern formed in the opening portion for connecting respective conductive portions of the plurality of semiconductor elements.

6 Claims, 13 Drawing Sheets

SEMICONDUCTOR DEVICE INCLUDING A PLURALITY OF TRANSISTORS

BACKGROUND OF THE INVENTION

1. Field of the Invention

The present invention relates to a semiconductor device and a method of manufacturing the same, and more specifically to a semiconductor device having a complementary MOS (CMOS) and a method of manufacturing the same.

2. Description of the Prior Art

As a semiconductor integrated circuit device becomes larger in scale, an LSI in which a high speed logic circuit and a mass storage unit are mounted on the same semiconductor chip is in general use. In order to achieve high speed operation of a large capacity semiconductor integrated circuit, it is most effective to mintaturize a MOS transistor so as to improve the performance thereof and (metal oxide semiconductor) to increase an integration degree by miniaturization. Furthermore, it is effective as a countermeasure for the reduction of parasitic components to lower the resistance of a gate electrode of the MOS transistor and to lower the resistance of a source/drain diffused layer effectively. Further, it also produces an effect to increase the integration degree and to shorten a mean interconnection length by increasing interconnection density.

On the other hand, an SRAM cell using six MOS transistors is used frequently as the memory of a device of this sort, and it is desired to reduce the cell area for the purpose of achieving a large capacity in this device.

The improvement of basic performance of a MOS transistor follows a scaling rule, and has been achieved by reduction in the measurements of a plane component and reduction of the thickness of a diffused layer located in a depth direction.

As to the reduction of the resistance of the gate electrode of a MOS transistor, a salicide technique in which refractory metal silicide and polysilicon are laminated one upon another, and the refractory metal silicide is formed in a self-align manner on a polycide gate obtained by applying patterning to the lamination or polysilicon is known.

Further, as to the effective reduction of the resistance of the source/drain diffused layer, a salicide technique in which refractory metal silicide is formed in a self-align manner on a diffused layer or a technique in which a metal film is formed on the diffused layer selectively by a chemical vapor deposition method is known.

Furthermore, in order to increase the interconnection density, a technique for interconnection without an interlayer insulating film instead of contacting interconnections through an opening portion of the interlayer insulating film, i.e., what is called a local interconnection technique is known. This technique is also used for the SRAM cell, thereby aiming at reduction of the cell area.

Further, as to a p-channel MOS transistor, it has become necessary to use a surface channel type in which a gate electrode composed of p-type polysilicon is used, but, in a gate electrode in which silicide is formed in the upper part as described above, impurities inside thereof are liable to be diffused in a lateral direction.

Furthermore, since the p-type MOS transistor and the n-type MOS transistor are formed in an n-well and a p-well, respectively, these transistors are arranged separately, and the space therebetween becomes larger, which is conspicuous in particular in an SRAM cell. In this case, a method of connecting the p-type gate electrode of the p-type MOS transistor and the gate electrode composed of n-type polysilicon of the n-type MOS transistor to each other by local interconnection is known.

For example, the local interconnection is set forth in the U.S. Pat. No. 4,821,085 and the method of forming the local interconnection is disclosed in U.S. Pat. No. 4,804,636 and U.S. Pat. No. 4,793,896. Further, an SRAM utilizing the local interconnection is disclosed in U.S. Pat. No. 4,804,636 and U.S. Pat. No. 4,975,756. Furthermore, that in which a $p^+$ type gate electrode and a $n^+$type gate electrode are connected by local interconnection is set forth in U.S. Pat. No. 4,804, 636 and U.S. Pat. No. 4,890,141.

The local interconnection has such a construction as shown in FIG. 1 for instance.

In FIG. 1, a transistor 3 is formed in a region surrounded by a field insulating film 2 on a semiconductor substrate 1, and an interconnection 4 is formed on the field insulating film 2. Further, in case a drain layer 5 of the transistor 3 and the interconnection 4 are connected to each other by local interconnection, after a titanium nitride film 8 is formed along the surfaces of the field insulating film 2, a pate electrode 6, a drain layer 5 and a source layer 7, patterning is applied to the titanium nitride film so as to leave the titanium nitride film 8 in a part from the drain layer 5 of the transistor 3 over to the interconnection 4, which is used as a local interconnection 9.

Besides, a titanium silicide layer 10 formed by a salicide technique is formed on the surfaces of the pate electrode 6, the drain layer 5 and the source layer 7.

Now, when patterning is applied to the titanium nitride film 8 in order to form the local interconnection 9, the titanium nitride film 8 located on the gate electrode 6 and the source layer 7 is removed by etching.

With the advance of the miniaturization of a semiconductor device, however, a titanium silicide layer 10 formed by the salicide technique gets thinner. Therefore, etching selectivity between the titanium silicide layer 10 and the titanium nitride film 8 used for local interconnection has become insufficient. Accordingly, the local interconnection 9 having the construction described above cannot be applied to a refined semiconductor device.

Further, when a polycide film composed of tungsten silicide and polysilicon is used as a forming film of the gate electrode 6, the local interconnection 9 described above cannot be used for the titanium nitride film 8 since it has no etching selectivity for tungsten silicide.

In order to improve the performance of a fine transistor and to control parasitic components thereby to achieve a high speed of a logic circuit, a tungsten polycide gate or a salicide gate obtained by forming titanium silicide is required. At the same time, it is required to improve the integration degree of a semiconductor device such as an SRAM, but such is the present state of affairs that the accuracy of the pattern configuration of the local interconnection has not been improved sufficiently.

Further, in the Japanese Patent Provisional Publication No. SH059-121868, a structure in that a molybdenum silicide pattern for connecting a diffused layer to an interconnection layer in an opening portion of an insulating film is provided, and this pattern is extended to another opening portion through above the insulating film is described. However, it is impossible to obtain sufficient flatness in a multi-layer structure with such a structure as described above.

SUMMARY OF THE INVENTION

It is an object of the present invention to provide a semiconductor device having an interconnection pattern for connecting among conductive portions of elements that is able to correspond to miniaturization of a semiconductor element, and moreover, for suppressing parasitic resistance of diffused layers constituting the semiconductor element and junction leakage and a method of manufacturing the same.

According to the present invention, a conductive pattern for connection is formed when the diffused layer and the interconnection layer of the semiconductor element are connected to each other, or when the diffused layers are connected together. The conductive pattern for connection is provided inside one opening portion formed in a region from one diffused layer over to the interconnection or another diffused layer in the interlayer insulating film covering the semiconductor element. These semiconductor elements are isolated from each other through an insulating layer.

As a result, the surface of the diffused layer to which the conductive pattern for connection is not connected is covered by the insulating layer. Thus, thin refractory metal silicide on the diffused layer surface becomes no longer removed by the etching when the conductive pattern for connection is formed. Namely, the material of the conductive pattern for connection, the interconnection material thereunder and the material of the diffused layer surface become no longer limited.

Then, lowering of the integration degree is controlled by forming the conductive pattern for connection while limiting to the opening portion and therearound. Namely, when the conductive pattern for connection is formed by utilizing a conductive layer constituting the interconnection having another function, arrangement of the conductive pattern for connection and that interconnection becomes difficult, thus preventing lowering of the integration degree.

The conductive pattern for connection can be utilized for another purpose such as connection of another conductive layer without increasing the process unless the integration degree is checked. Namely, by using the conductive film constituting the conductive pattern for another local interconnection, the interconnection density is improved and the mean interconnection length is reduced without increasing the process, thus promoting to achieve a high speed. Moreover, an opening portion having a wide area of exposing the diffused layer is formed and the conductive pattern is made to exist in the opening portion, thereby to lower the parasitic resistance of the diffused layer.

When the conductive pattern for connection of the present invention is applied, it is any of a layer requiring ohmic contact for both $p^+$ and $n^+$ types of semiconductors, a layer in which high temperature processing becomes impossible because of a layer above TiSi, or a layer in which the interconnection resistance becomes an issue. Accordingly, it is desirable to use metal as the material of the conductive pattern for connection, and it is also desirable that both the interlayer insulating film and the conductive pattern for connection are thinner as compared with other interconnection layers.

Due to a fact that it is easy to make the layer thinner and accuracy in fine working is easily obtainable, tungsten is excellent as the material of the conductive pattern for connection. Further, since it is favorable to use fluorine as a principal etchant when tungsten is used, it is recommendable to form the opening portion where the conductive pattern for connection is arranged in an insulating film containing $SiO_2$ as the chief ingredient, thereby increasing the selectivity for the foundation (insulating film) higher when tungsten is etched. Nevertheless, since it is not sufficiently high as the selectivity, being approximately 2 typically, existence of isotropic components becomes necessary in etching when patterning is applied to tungsten. This is because of such a reason that, when difference of level exists in the gate electrode, tungsten is liable to remain on the sidewall of the gate electrode in anisotropic etching, and excessive etching of the degree of the height of the difference of level becomes necessary in order to remove tungsten on the sidewall, thus requiring to make the film thickness of the insulating film thicker to such an extent that it does not disappear by such etching. In this case, it is desirable that the etching rate in a horizontal direction with respect to the substrate reaches $\frac{1}{3}$ or higher than the etching rate in the perpendicular direction.

Since the conductive pattern for connection is formed only in the opening portion and the peripheral portion thereof according to the present invention, it is advantageous to achieve flatness in a multi-layer structure.

According to another embodiment of the present invention, when an opening portion is formed in an insulating film, an insulative sidewall is formed on the side portion of the interconnection existing under the insulating film and passing through the inside of the opening portion, and the sidewall is made to overlap the edge portion of the diffused layer in the opening portion or the interconnection is made to project toward the diffused layer side in the opening portion only. Thus, even when the diffused layer is of an LDD structure, the low concentration layer of the LDD structure is covered and protected by the sidewall or the insulating layer under the interconnection. Therefore, the conductive pattern for connection does not come into contact with the low concentration layer, and the leak current neither passes to the substrate side. Moreover, since the edge portion of the field oxide film surrounding the diffused layer is covered at the same time, the edge portion of the field oxide film is removed by etching when the opening portion is formed, and the leak current does neither pass therefrom. Further, the interconnection and the diffused layer approach each other in this case, and reduction in the cell area progresses.

DESCRIPTION OF THE PREFERRED EMBODIMENTS (The first embodiment)

Figure 1:
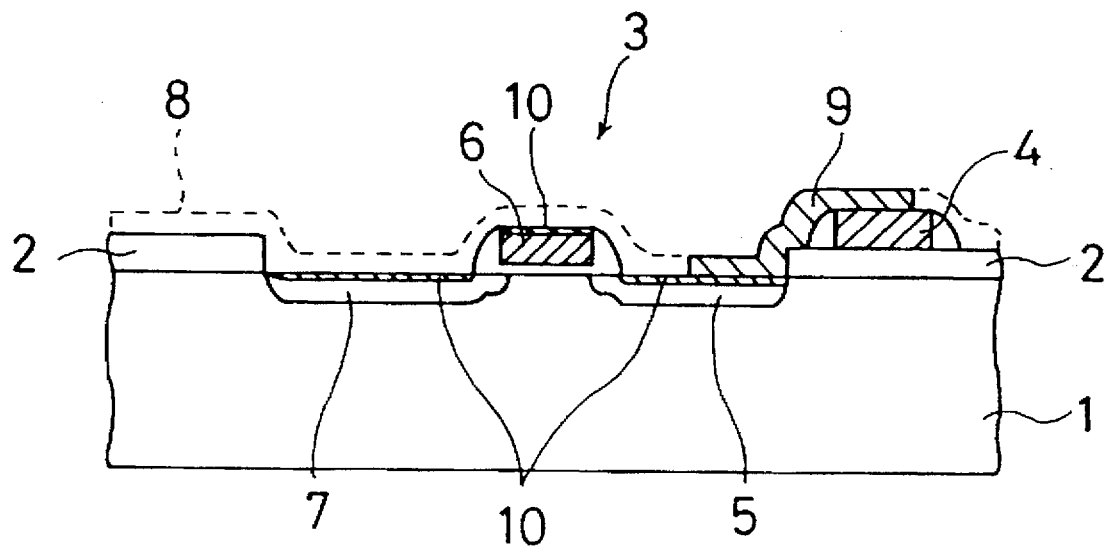
FIG. 1 is a sectional view showing an example of a conventional device.
Figure 2A:
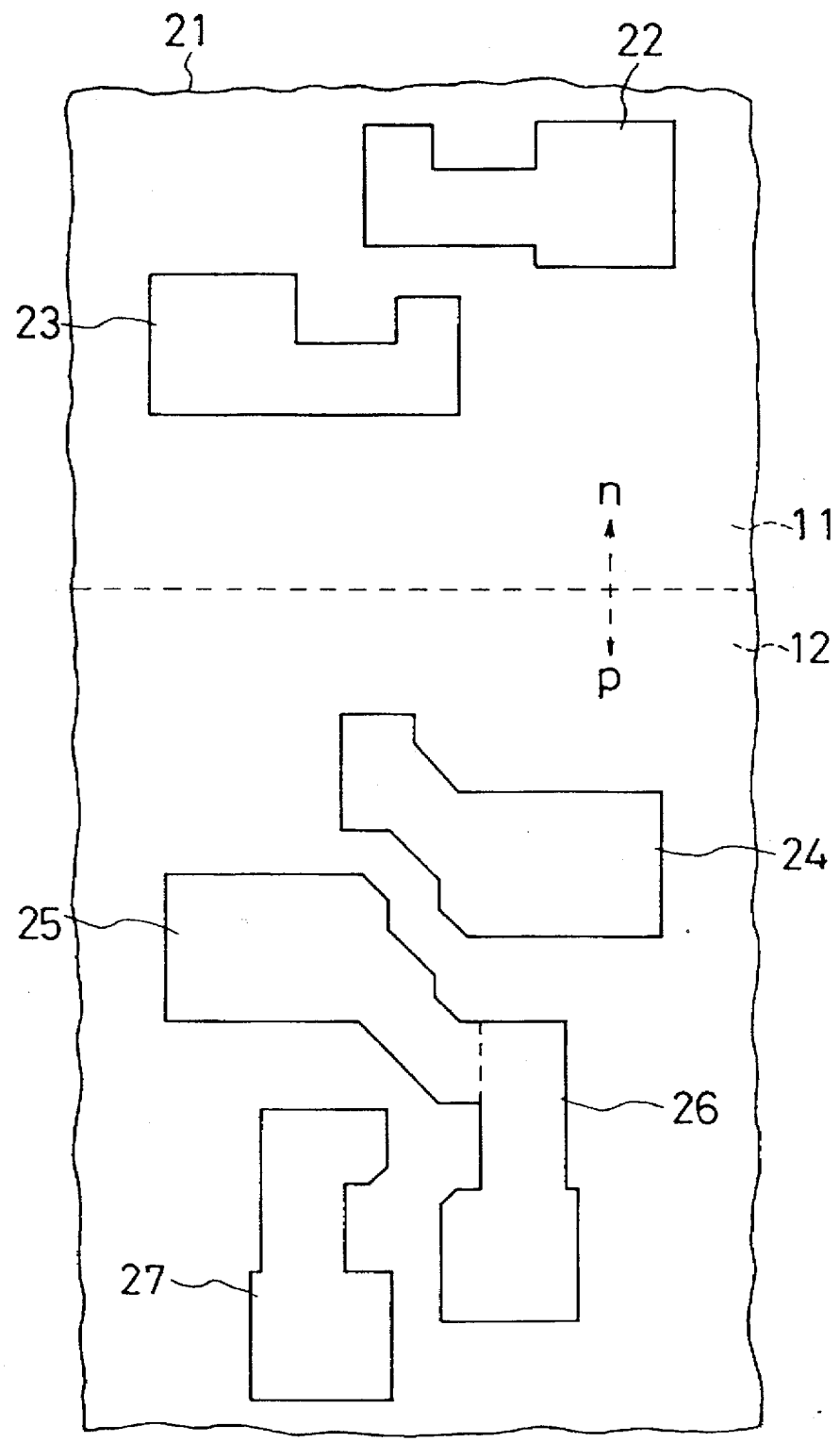
FIGS. 2A to 2C are plan views showing a manufacturing process of a first embodiment of the present invention.
Figure 2B:
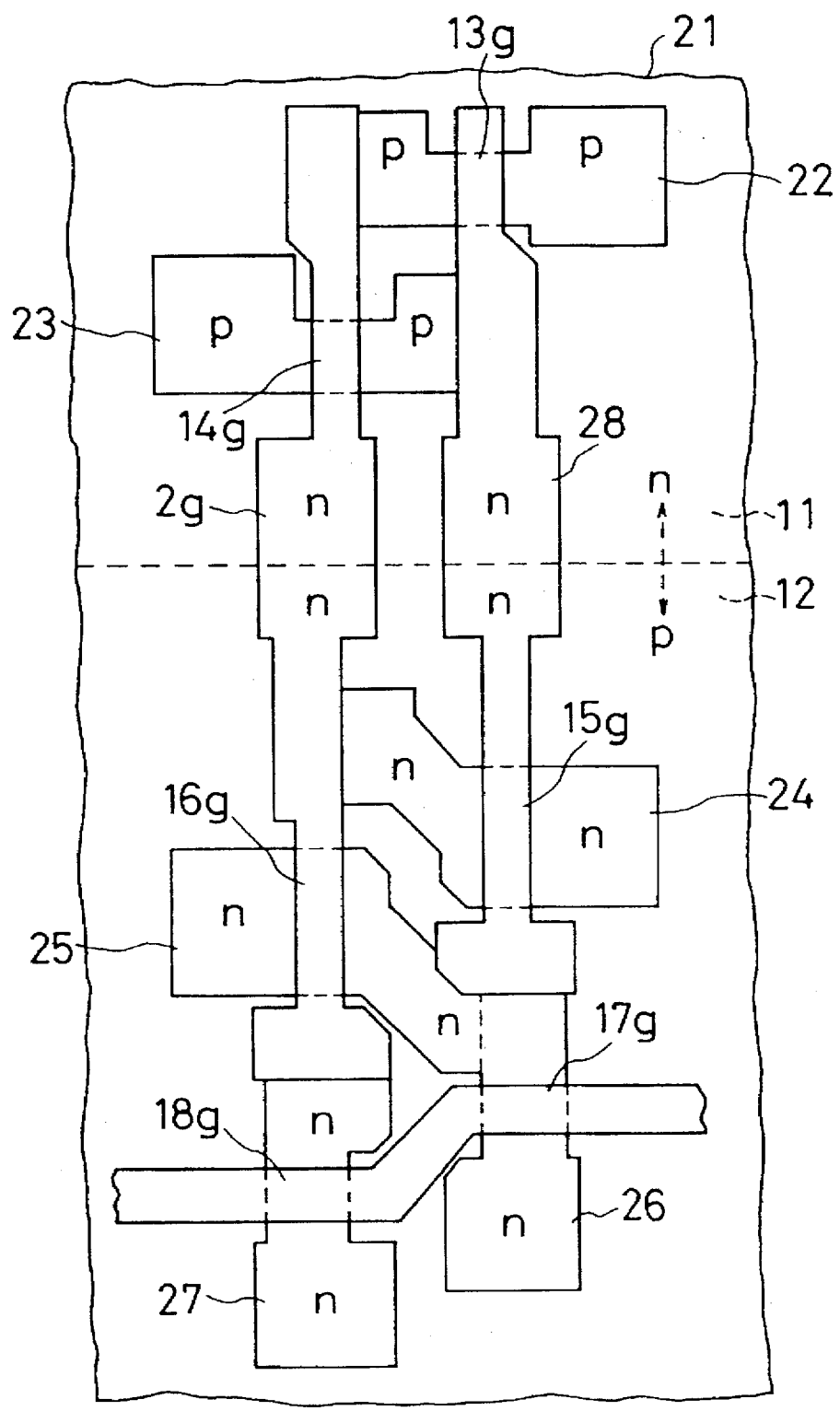
Figure 2C:
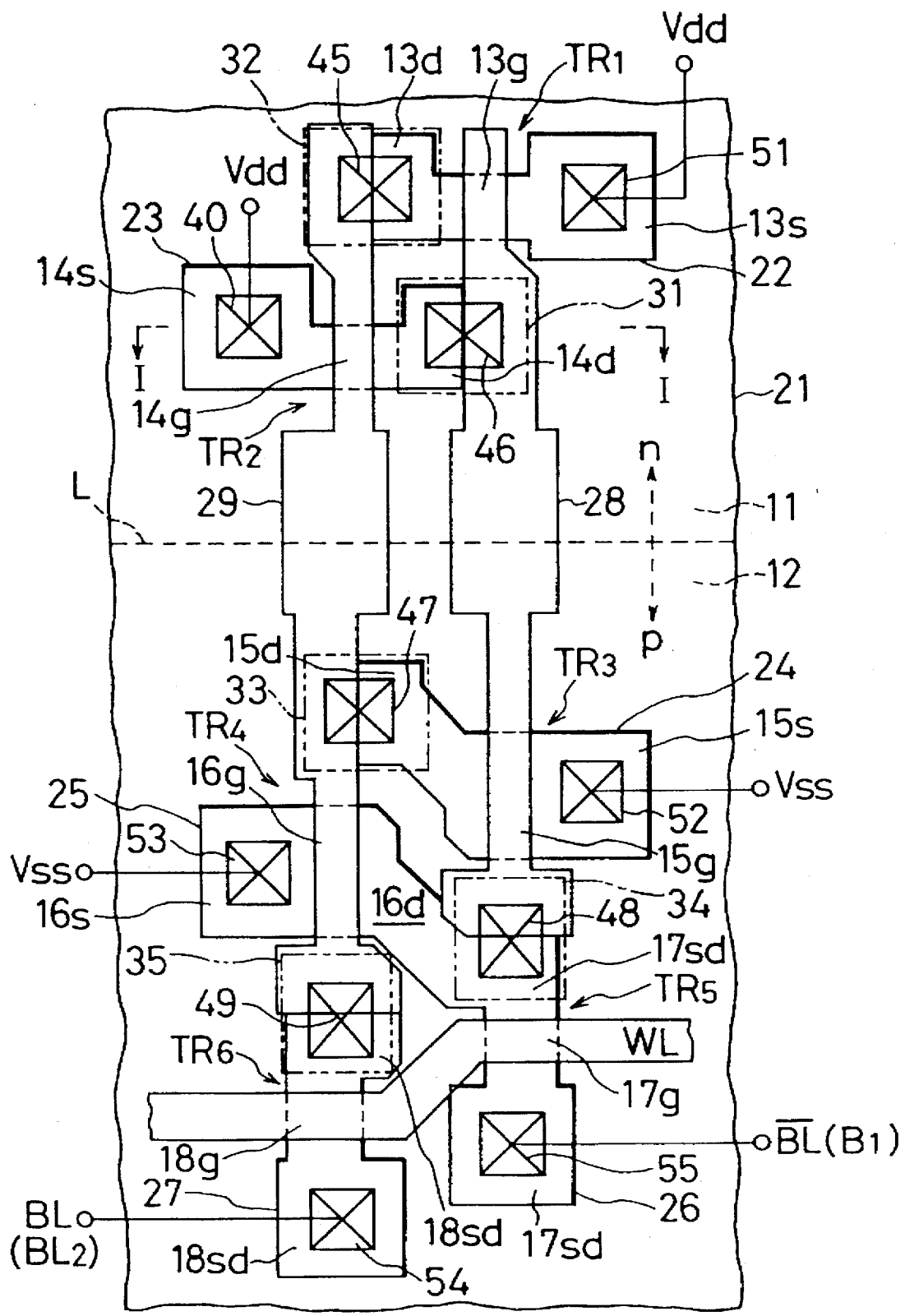
Figure 3A:
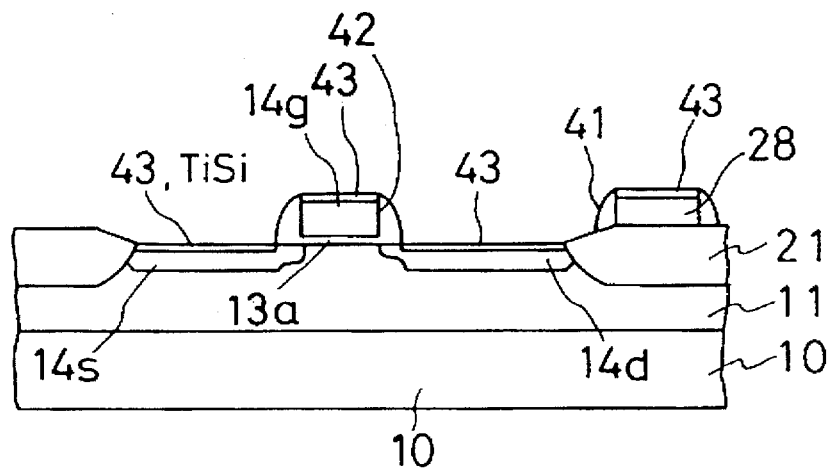
FIGS. 3A to 3C are sectional views showing a manufacturing process of the first embodiment of the present invention, which are sectional views of a part taken along a line I—I in FIG. 2C.
Figure 3B:
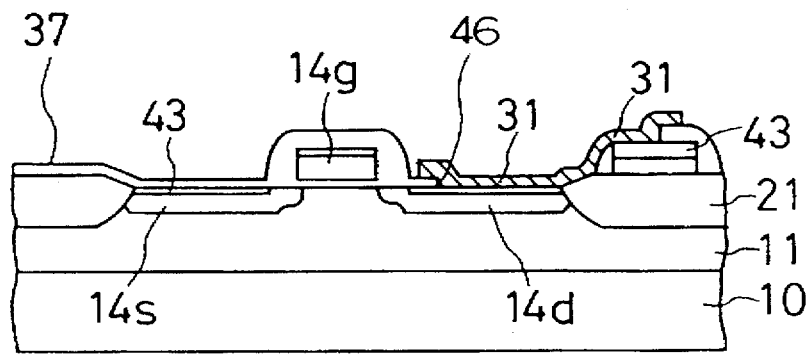
Figure 3C:
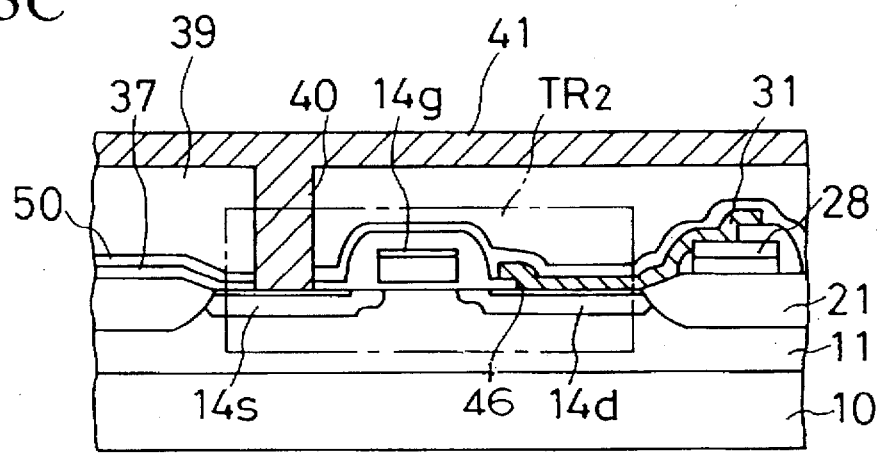
Figure 4:
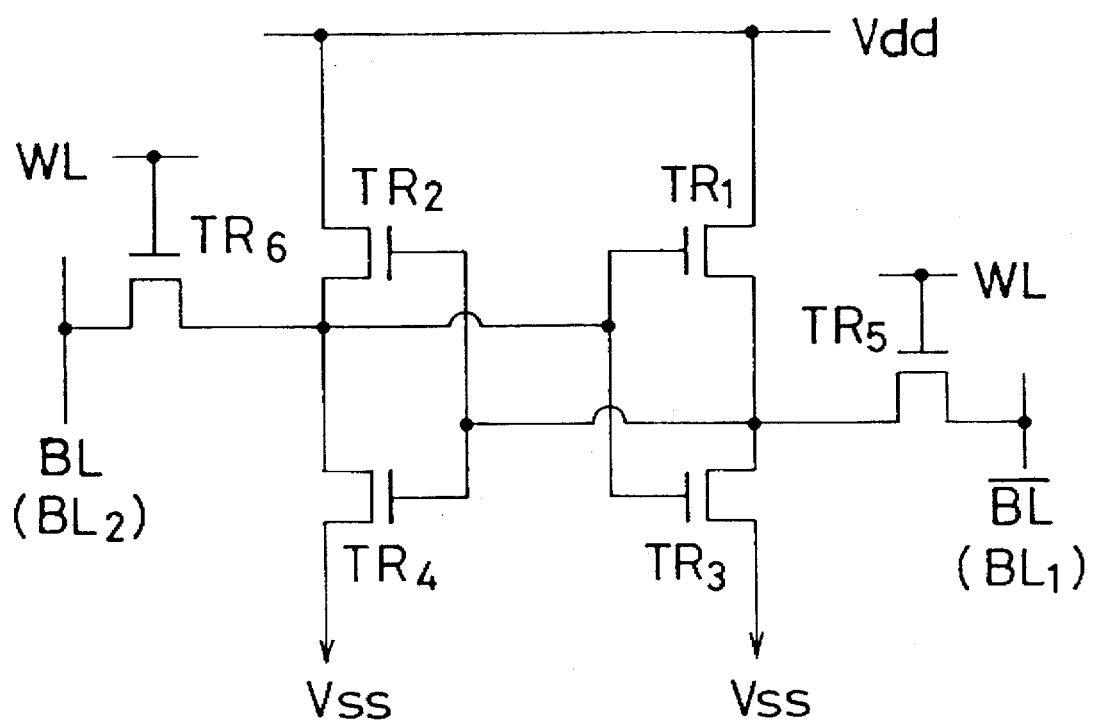
FIG. 4 is an equivalent circuit diagram of a semiconductor device of the first embodiment of the present invention.

FIG. 2A to FIG. 2C are plan views showing a process of forming an SRAM cell of a first embodiment of the present invention, FIG. 3A to FIG. 3C are partial sectional views thereof, and FIG. 4 is an equivalent circuit diagram of the SRAM cell. Besides, interlayer insulating films are all omitted in FIG. 2A to FIG. 2C.

First, the SRAM cell according to the first embodiment of the present invention will be described with reference to FIG. 2C.

In FIG. 2C, an n-type well 11 and a p-type well 12 are formed on a semiconductor substrate 10 such as silicon, and two p-type load transistors $TR_1$ and $TR_2$ are formed in the n-type well 11. Further, two n-type driving transistors $TR_3$ and $TR_4$ and two n-type transfer transistors $TR_5$ and $TR_6$ are formed in the p-type well 12. These transistors are formed of MOS transistors.

Further, the load transistors $TR_1$ and $TR_2$, the driving transistors $TR_3$ and $TR_4$, and the transfer transistors $TR_5$ and $TR_6$ are formed in active regions 22 to 27 surrounded by a field insulating film 21. Further, two lines of gate interconnections 28 and 29 are arranged on the field insulating film 21, which pass through active regions 22 to 25 of the load transistors $TR_1$ and $TR_2$ and the driving transistors $TR_3$ and $TR_4$ and function as gate electrodes of the transistors $TR_1$ to $TR_4$ in the regions where the interconnections pass through. These gate interconnections 28 and 29 are constituted of polycide films.

Two load transistors $TR_1$ and $TR_2$ have p-type source layers (a diffused layer) 13s and 14s and drain layers (a diffused layer) 13d and 14d in a direction parallel to a boundary line L between the n-type well 11 and the p-type well 12, and gate electrodes 13g and 14g are formed therebetween on the n-type well 11 through an insulating film not shown.

Further, while the gate electrode 13g of the first load transistor $TR_1$ is connected to the drain layer 14d of the second load transistor $TR_2$ through a local interconnection (a conductive pattern for connection) 31, the gate electrode 14g of the second load transistor $TR_2$ is connected to the drain layer 13d of the first load transistor $TR_1$ through a local interconnection 32. Furthermore, a Vdd interconnection (not shown) for applying voltage Vdd is connected to respective source layers 13s and 14s of the two load transistors $TR_1$ and $TR_2$.

Source layers 15s and 16s and drain layers 15d and 16d of two driving transistors $TR_3$ and $TR_4$ are arranged in an oblique direction with respect to the boundary line L between the n-type well 11 and the p-type well 12, and gate electrodes 15g and 16g are formed through an insulating film not shown on the p-type well 12 between the source layers 15s and 16s and the drain layers 15d and 16d. These gate electrodes 15g and 16g are connected to the drain layers 15d and 16d of the other driving transistors $TR_3$ and $TR_4$ mutually through local interconnections 33 and 34.

Two transfer transistors $TR_5$ and $TR_6$ are those in which the parts passing through active regions 26 and 27 of a word line WL are used as gate electrodes 17g and 18g, and these gate electrodes 17g and 18g extend in a direction almost parallel to the boundary line L between the n-type well 11 and the p-type well 12, and source/drain layers 17sd and 18sd are formed in the active regions 26 and 27 on both sides thereof.

The source/drain layer 17sd on one side of the first transistor $TR_5$ is connected directly to the drain layer 16d of the second driving transistor $TR_4$, and furthermore, the source/drain layer 17sd thereof is connected to a first gate interconnection 28 that becomes the gate electrode 15g of the first driving transistor $TR_3$ through the local interconnection 34. Further, the source/drain layer 18sd on one side of the second transfer transistor $TR_6$ is connected to a second gate interconnection 29 that becomes the gate electrode 16g of the second driving transistor $TR_4$ through a local interconnection 35.

Further, bit lines $BL_1$ and $BL_2$ that are different from each other are connected to remaining source/drain layers 17sd and 18sd of the two transfer transistors $TR_5$ and $TR_6$.

Besides, respective gate electrodes 13g to 18g are formed on the n-type well 11 or the p-type well 12 through a gate insulating film not shown.

An equivalent circuit of the SRAM cell constituted by these load transistors $TR_1$ and $TR_2$, driving transistors $TR_3$ and $TR_4$ and transfer transistors $TR_5$ and $TR_6$ is shown in FIG. 4.

Now, local interconnection layers 31 to 35 for conducting among the source layer, the drain layer and the gate electrode have such a construction as shown in FIG. 3C.

FIG. 3C shows a sectional view taken along a line I—I of the SRAM in FIG. 2C.

In FIG. 3C, the load transistor $TR_2$ and the gate interconnection 28 therearound are covered with a first interlayer insulating film 37 the whole body of which is composed of $SiO_2$. Further, an opening portion 46 is formed in the first interlayer insulating film 37 at a portion from the drain layer 14d over to the gate interconnection 28 on the field insulating film 21. Further, the drain layer 14d exposed from the opening portion 46 and the gate interconnection 28 are connected by the local interconnection 31 composed of tungsten.

Further, a second interlayer insulating film 39 covering the local interconnection 31, the first interlayer insulating film 37 or the like is formed of PSG for instance, an opening portion 40 is formed on a source layer 14s in the second interlayer insulating film 39, and a Vdd interconnection layer 41 is formed through this opening portion 40.

Next, a process of forming the local interconnections 31 to 35 described above will be described briefly with reference to FIGS. 2A to 2C and FIGS. 3A to 3C.

First, the n-type well 11 and the p-type well 12 as shown in FIG. 2A are formed on a semiconductor substrate 10 composed of silicon, and then, the field insulating film 21 surrounding the active regions 22 to 27 where respective transistors are formed is formed in a thickness of 3,500 Å.

Next, the surfaces of the n-type well 11 and the p-type well 12 exposed from the active regions 22 to 27 are oxidized thermally so as to form a gate oxide film 13a having a thickness of 80 Å as shown in FIG. 3A. Then, n-type impurities for threshold control and p-type impurities for threshold control are introduced into the active regions 22 and 23 of the n-type well 11 and the active regions 24 to 27 of the p-type well 12, respectively.

Thereafter, a polycrystalline silicon film is formed in a thickness of 1,500 Å by a CVD method, then phosphorus ions are introduced into the laminated film and patterning is applied by the photolithography method, thereby to form gate interconnections 28 and 29 and a word line WL such as shown in FIG. 2B.

These gate interconnections 28 and 29 pass through the first to the fourth active regions 22 to 25, and function as respective electrodes 13g to 16g in the portion where they pass through. Further, the word line WL passes through the remaining active regions 26 and 27 and functions as gate electrodes 17g and 18g in that part. The gate interconnections 28 and 29 and the word line WL are located on the field insulating film 21 in the regions other than the active regions 22 to 27.

Thereafter, as shown in FIG. 2B, p-type impurities such as boron are introduced into the active regions 22 and 23 of the n-type well 11, and n-type impurities such as arsenic are introduced into the active regions 24 to 27 of the p-type well 12, thereby to form source layers 13s to 16s, drain layers 13d to 16d and source/drain layers 17sd and 18sd having low concentration, respectively.

Next, after laminating a SiO$_2$ film 1,000 Å thick by a CVD method, isotropic etching is applied to the SiO$_2$ film by RIE in a direction perpendicular to the substrate surface. With this, an insulative sidewall 42 such as illustrated in FIG. 3A is formed on the side portions of the gate interconnections 28 and 29 and the word line WL.

Then, n-type impurities of high concentration such as phosphorus and arsenic are introduced into the active regions 24 to 27 of the p-type well 12 and p-type impurities such as boron of high concentration are introduced into the active regions 22 and 23 of the n-type well 11 with the sidewall 42, the gate interconnections 28 and 29, the word line WL and the field insulating film 21 as a mask. Then, the impurities are activated at 800° C., and the source layer 14s and the drain layer 14d are formed to show a lightly doped drain (LDD) construction as shown in FIG. 3A for instance.

Next, a titanium film is formed in a thickness of 300 Å by sputtering, then titanium is alloyed with silicon of the gate interconnections 28 and 29, the source layers 13s to 16s, the drain layers 13d to 16d and the source/drain layers 17sd and 18sd by rapid thermal annealing (RTA) at 650° C. so as to form a titanium silicide layer 43, and useless parts are removed thereafter with an ammonia solution thereby to remove the titanium film that has not been alloyed. With this, as shown in FIG. 3A for instance, the titanium silicide (TiSi) layer 43 is formed in a self-align manner on the surfaces of the gate electrode 14g (a gate interconnection), the source layer 14s and the drain layer 14d.

Then, SiO$_2$ is grown in the thickness of 500 Å by a plasma CVD method, which is used as the interlayer insulating film 37. Furthermore, patterning is applied to the interlayer insulating film 37 by the photolithography method using a mask and RIE, thereby to form opening portions 45 to 49 in the regions where the gate interconnections 28 and 29 are being connected to the source layers 13s to 16s, the drain layers 13d to 16d and the source/drain layers 17sd and 18sd as shown in FIG. 2C.

Next, after forming tungsten or a tungsten silicide film having the thickness of 500 Å by a sputtering method, patterning is applied to the tungsten film by the photolithography method using a mask and RIE so as to leave the tungsten film in the opening portions 45 to 49 and therearound, which are used as the local interconnections 31 to 35 such as shown in FIG. 2C and FIG. 3B.

The reactive ion etching (RIE) in this case is performed in such a manner that a plane-parallel plate type RIE apparatus is used, sulfur hexafluoride (SF$_6$) gas is introduced into an etching atmosphere at 200 SCCM, the pressure of the atmosphere ia set to 0.2 Torr, the radio frequency electric power is set to 300 W and etching is applied for 14 seconds. According to such conditions, tungsten does not remain behind at a step portion of the SiO$_2$ interlayer insulating film 37 that becomes the foundation, and the film thickness of the interlayer insulating film 37 is reduced only by about 150 Å, thus making fine working of dimensional shift at almost zero possible. Furthermore, in the etching under these conditions, the etching rate in a lateral direction has been shown at ⅓ or more of that in a longitudinal direction.

Besides, tungsten is advantageous since the accuracy of fine working is obtainable easily and the selectivity with SiO$_2$ gets higher when fluorine containing gas is used as the etchant, but etching containing isotropic components is preferable in order to eliminate survival of tungsten at the steps.

Thereafter, a SiO$_2$ film 50 having the thickness of 3,500 Å is formed by a plasma CVD method, and then, SOG 1,000 Å thick is formed by a rotational application method. This SOG becomes a second interlayer insulating film 39.

Furthermore, as shown in FIG. 2C, after forming opening portions 40 and 51 to 55 for connecting a Vdd power source interconnection, a Vcc power source interconnection or the like to the second interlayer insulating film 39, a SiO$_2$ film and a SOG film not shown are formed by lamination by a plasma CVD method, and opening portions are formed in this laminated film so as to form a bit line, thus completing a semiconductor integrated circuit including a high speed logic element and a highly integrated SRAM.

Now, a cobalt silicide by a salicide technique may be used or tungsten may be grown selectively on the surfaces of the source layer and the drain layer as refractory metal silicide formed on the surfaces of the source layer and the drain layer.

Furthermore, it is not necessarily required to form refractory metal silicide on the source layer and the drain layer, but, in this case, it may be arranged so that a polycrystalline silicon film and a tungsten silicide film are formed in the thickness of 500 Å and 1,500 Å in order, respectively, by the CVD method, then impurity ions are implanted into these films, then a SiO$_2$ film is formed in the thickness of 1,000 Å by the CVD method, and furthermore, etching is applied continuously to the SiO$_2$ film, tungsten silicide and the polycrystalline silicon film by the photolithography method using a mask and RIE as a process of forming the gate interconnections 28 and 29 and the word line WL.

According to the construction described above, since the source layers 13s to 16s or the like on the side where the local interconnections 31 to 35 are not connected are covered with the interlayer insulating film 37, the thickness of the source layer and the drain layer that are formed into thin layers by etching in case the local interconnections are formed is not reduced when patterning is applied to a conductive film constituting the local interconnections 31 to 35. Moreover, even when refractory metal silicide film 43 by the salicide technique has been formed on the surfaces of the source layer and the drain layer, this film is not removed.

As a result, even when the source layer and the drain layer get thinner because of the refinement of the transistor, no trouble is caused in particular, but the SRAM can be made small in size and high in speed at the same time.

Besides, the gate interconnection mentioned above is a part of the gate electrode. Further, the semiconductor element may be an element other than an FET such as a bipolar transistor.

(The second embodiment)

In the first embodiment, the gate interconnections (gate electrodes) 28 and 29 for connecting transistors to one another are formed into an n-type as shown in FIG. 2B. When MOS transistors constituting the SRAM are all formed into a surface channel type, it is required to implant the impurities introduced into the gate interconnections 28 and 29 constituting the gate electrodes separately in the n-type well 11 and the p-type well 12.

However, when p-type and n-type impurity regions are in existence in the gate interconnections 28 and 29, the impurities are diffused and compensate for each other in the boundary region thereof, and the conductivity might be lowered.

Figure 5A:
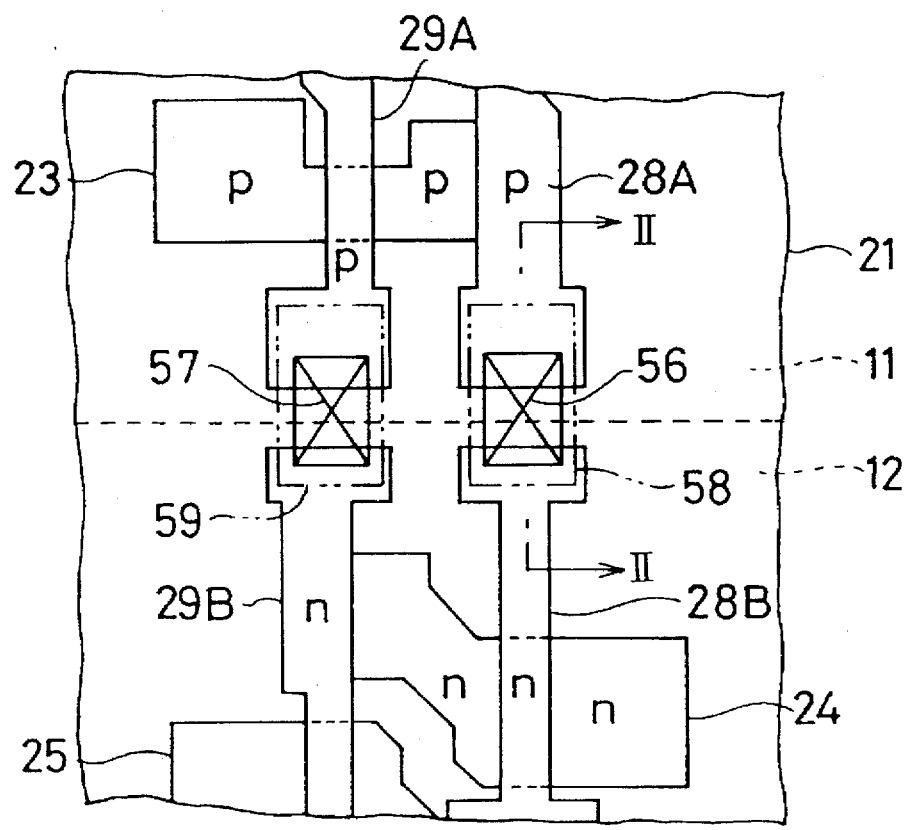
FIG. 5A is a plan view showing a principal part of a semiconductor device of a second embodiment of the present invention.
Figure 5B:
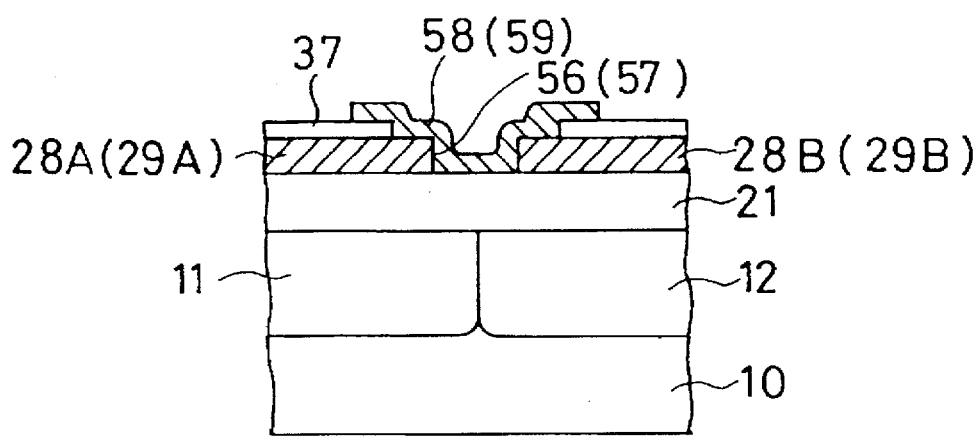
FIG. 5B is a sectional view of a part taken along a line II—II in FIG. 5A.

So, as shown in FIGS. 5A and 5B, gate interconnections 28A and 28B, 29A and 29B separated in the boundary regions are formed, and p-type impurities are introduced into gate interconnections 28A and 29A on the side of the n-type well 11 and p-type impurities are introduced into gate interconnections 28B and 29B on the side of the p-type well 12. The divided gate interconnections 28A and 28B (29A and 29B) are made conductive through an opening portion 56 (57) of the interlayer insulating film 37 thereon and the local interconnection 58 (59) formed therearound.

Those local interconnections 58 and 59 are formed simultaneously with the formation of the local interconnections shown in the first embodiment.

(The third embodiment)

In the first embodiment, the gate interconnections 28 and 29 excluding those parts that become gate electrodes are formed on the field insulating film 21, but following troubles occur sometimes.

Figure 6:
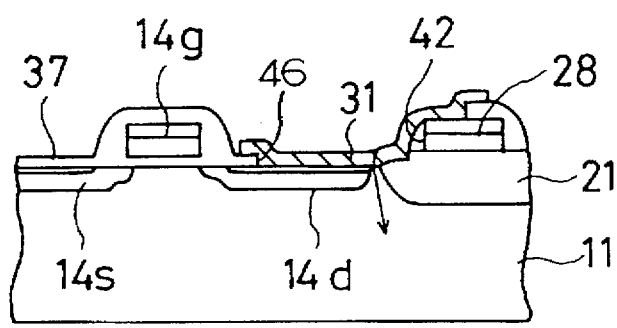
FIG. 6 is a sectional view showing problems when the local interconnection is formed.

Namely, if the opening portion 46 formed in the interlayer insulating film 37 comes to an edge portion of the field insulating film 21 when the local interconnection 31 is formed, it is apprehended that the edge portion is etched as shown in FIG. 6 when the opening portion is formed, and the n-type well 11 and the p-type well 12 are exposed. Further, the low concentration region of the source/drain layer having the LDD construction comes into contact with the local interconnection.

With this, a leak current is applied between the local interconnection 31 and the wells 11 and 12.

Thus, a following construction may also be adopted for the purpose of reduction of the leak current.

Figure 7A:
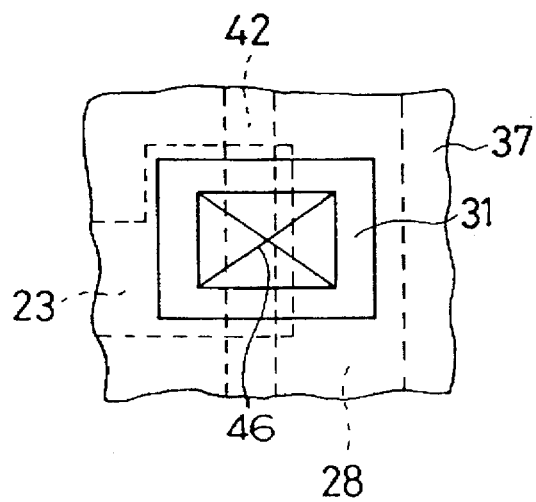
FIGS. 7A and 7B are a plan view and a sectional view for forming a first local interconnection in a third embodiment of the present invention.
Figure 8A:
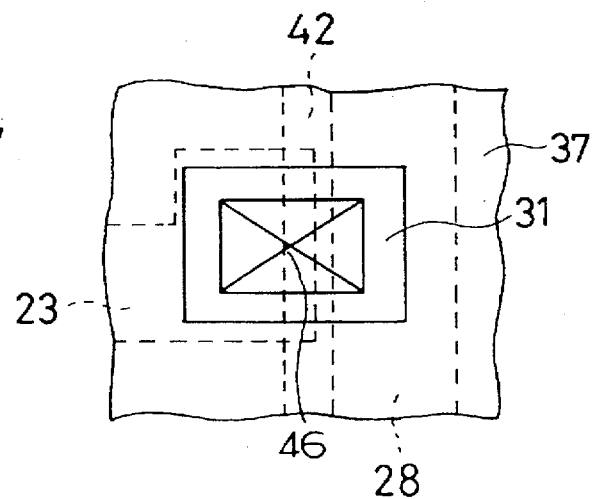
FIGS. 8A and 8B are a plan view and a sectional view for forming a second local interconnection in the third embodiment of the present invention.
Figure 7B:
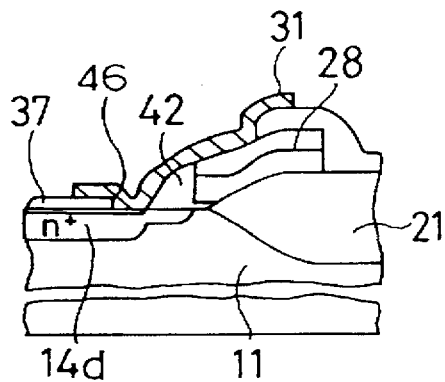
Figure 8B:
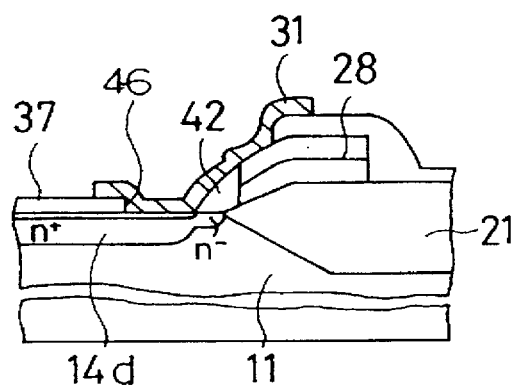

For example, the gate interconnection 28 may be projected into the active region 23 as shown in FIGS. 7A and 7B, or an insulative sidewall 42 formed on the side portion of the gate interconnection 28 may be projected into the active region 23 as shown in FIGS. 8A and 8B.

According to such an arrangement, since the low concentration layers of the source layer 14s and the drain layer 14d are covered by the sidewall 42 of the gate interconnection 28, the low concentration layer neither come into contact with the local interconnection 46 nor the wells 11 and 12 are exposed. With this, no leak current becomes to flow from the local interconnection 46.

Figure 9A:
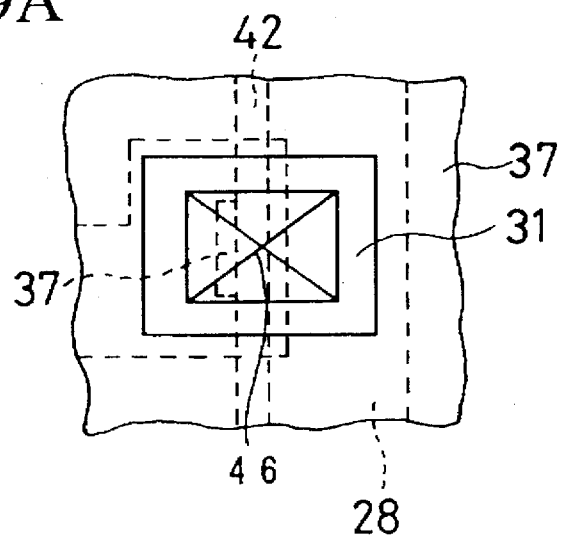
FIGS. 9A to 9C are a plan view and sectional views for forming a third local interconnection of the third embodiment of the present invention.
Figure 9B:
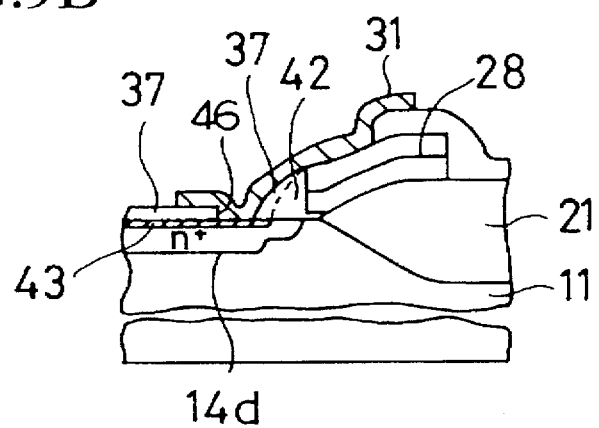

Furthermore, when the film thickness and the etching conditions are adjusted and a part of the interlayer insulating film 37 is made to remain on the sidewall 42 when the opening portion 46 is formed in the interlayer insulating film 37 as shown in FIGS. 9A and 9B, the low concentration regions of the source/drain layers 14s and 14d are protected surely, thereby to check connection between the local interconnection 31 and the low concentration layer.

In order to increase the width of the sidewall 42 as described above, it is sufficient to form the opening portion 46 under following conditions for instance.

After the source/drain layers 14s and 14d are formed, the interlayer insulating film 37 composed of $SiO_2$ having the thickness of 500 to 1,000 Å is formed, and then the opening portion 46 is formed by the photolithography method using RIE. In this case, however, when over etching after forming the opening portion 46 is set to approximately 200 Å, the sidewall 42 expands by approximately 0.03 to 0.06 μm in a surface direction.

Figure 9C:
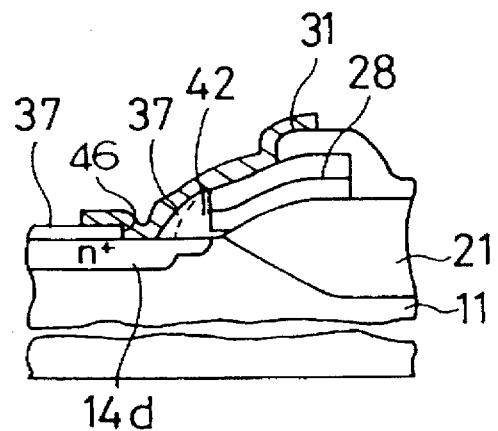

Besides, on the surfaces of the source/drain layers 14s and 14d, the refractory metal silicide layer 43 may be either in existence as shown in FIG. 9B or in nonexistence as shown in FIG. 9C.

(The fourth embodiment)

It has been described in the above-mentioned embodiment to form a local interconnection with respect to the SRAM cell of the semiconductor storage device, but the local interconnection may also be applied to the regions other than the SRAM cell. So, a local interconnection in a CMOS inverter will be described in the next place.

Figure 10A:
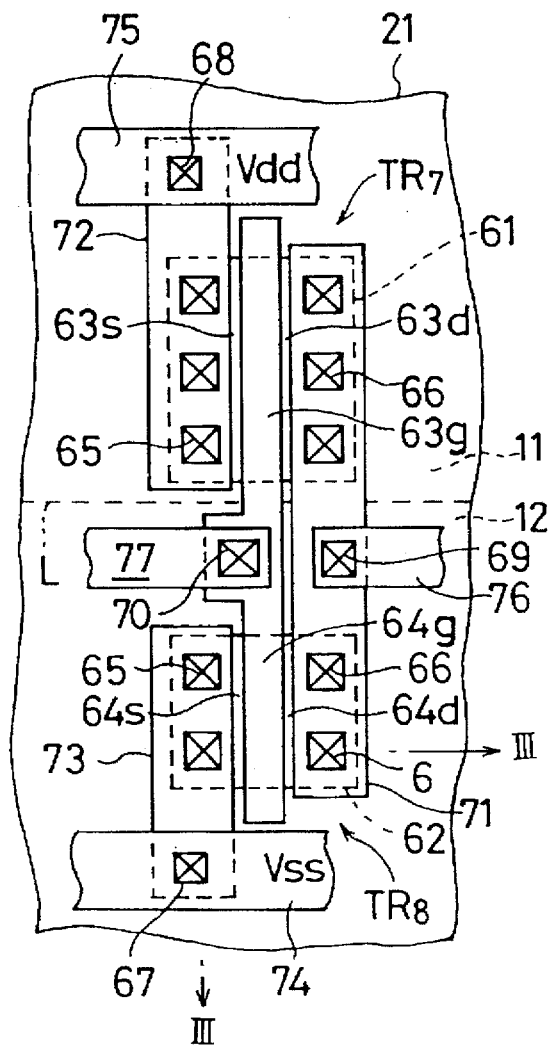
FIG. 10A is a plan view showing a semiconductor device of a fourth embodiment of the present invention.
Figure 10B:
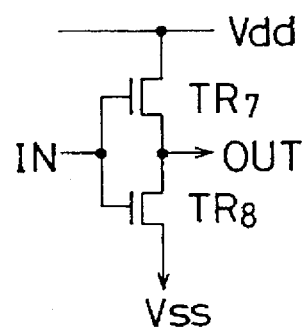
FIG. 10B is a sectional view of a part taken along a line III—III thereof.

FIG. 10A is a plan view showing a fourth embodiment of the present invention, FIG. 10B is a sectional view taken along a line III—III thereof, and FIG. 10B is an equivalent circuit diagram of a CMOS inverter.

Figure 10C:
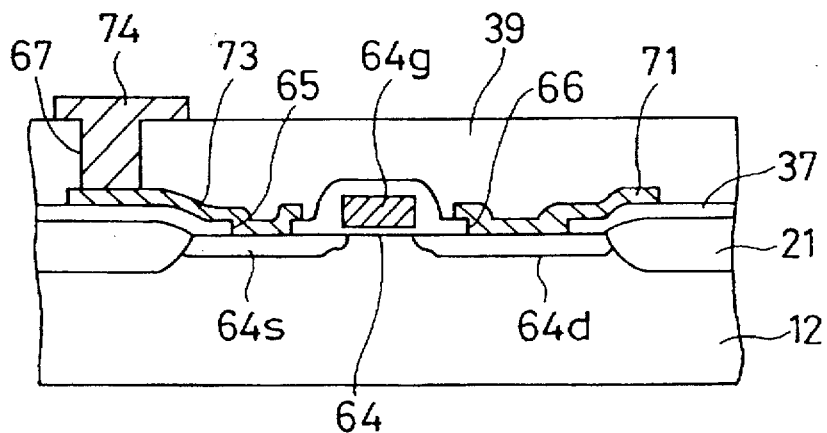
FIG. 10C is an equivalent circuit diagram of the semiconductor device of the fourth embodiment of the present invention.

In FIGS. 10A to 10C, active regions 61 and 62 surrounded by a field insulating film 21 are set in an n-type well 11 and a p-type well 12, respectively, and gate electrodes 63g and 64g are formed at centers of these active regions 61 and 62 through a gate insulating film 64, which are formed in one body.

The gate electrodes 63g and 64g are structured of a polycide film composed of tungsten silicide and n-type polycrystalline silicon for instance. Further, a p-type source layer 63s and a drain layer 63d are introduced onto both sides of the gate electrode 63g in the active region 61 of the n-type well 11, thus forming a p-type MOS transistor $TR_7$. Furthermore, n-type source layer 64s and drain layer 64d are formed on both sides of the gate electrode 64g in the active region 62 of the p-type well 12, thus forming an n-type MOS transistor $TR_8$.

The whole bodies of these MOS transistors $TR_7$ and $TR_8$ are covered with an interlayer insulating film 37 composed of $SiO_2$ as illustrated in FIG. 10B. Further, a plurality of opening portions 66 are formed in the drain layers 63d and 64d of the p-type MOS transistor $TR_7$ and the n-type MOS transistor $TR_8$, and a local interconnection 71 is formed in the region including these opening portions 66 and the interlayer insulating film 37 therearound.

Further, a plurality of opening portions 65 are formed in respective source layers 63s and 64s of the n-type and the p-type MOS transistors $TR_7$ and $TR_8$, and local interconnections 72 and 73 extending from the opening portions 65 over to the field insulating film 21 on an opposite side of the boundary line L between the n-type well 11 and the p-type well 12.

Furthermore, opening portions 67 to 70 are formed on respective local interconnections 71 to 73 and gate electrodes 63g and 64g among interlayer insulating films 39 covering the local interconnections 71 to 73, and a Vss interconnection 74, a Vdd interconnection 75, an output interconnection 76 and an input interconnection 77 are formed through these opening portions 67 to 70.

Since a plurality of opening portions 65 and 66 are formed at appropriate intervals in the source layers 63s and 64s and the drain layers 63d and 64d according to such local interconnections 71 to 73, it is possible to reduce parasitic resistances of the source and the drain without increasing the process. Moreover, since the local interconnections are formed simultaneously with the SRAM cell, the process is not increased, thus making it possible to improve the interconnection density and to reduce the mean interconnection length so as to aim at achievement of a high speed.

(The fifth embodiment)

Next, a modified example of the fourth embodiment will be described.

Figure 11:
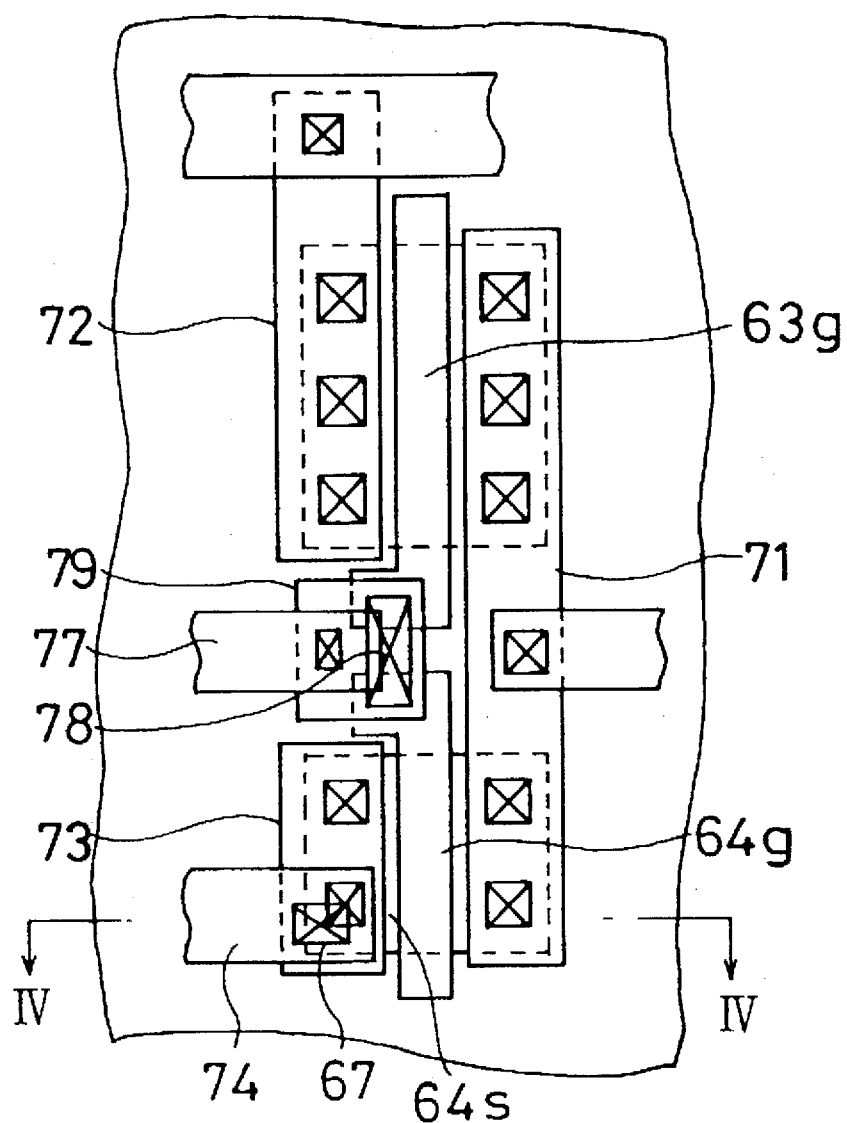
FIG. 11 is a plan view showing a semiconductor device of a fifth embodiment of the present invention.

In FIG. 10A, when polycrystalline silicon constituting the gate electrode 63g of the p-type MOS transistor TR$_7$ is formed into a p$_+$ type, and polycrystalline silicon constituting the gate electrode 64g of the n-type MOS transistor TR$_8$ is formed into an n$^+$ type, these gate electrodes 63g and 64g are separated from each other, an opening portion 78 is provided in the interlayer insulating film 37 covering those gate electrodes, and a local interconnection 79 is formed therein and therearound so as to connect two gate electrodes 63g and 64g to each other as shown in FIG. 11.

Figure 12A:
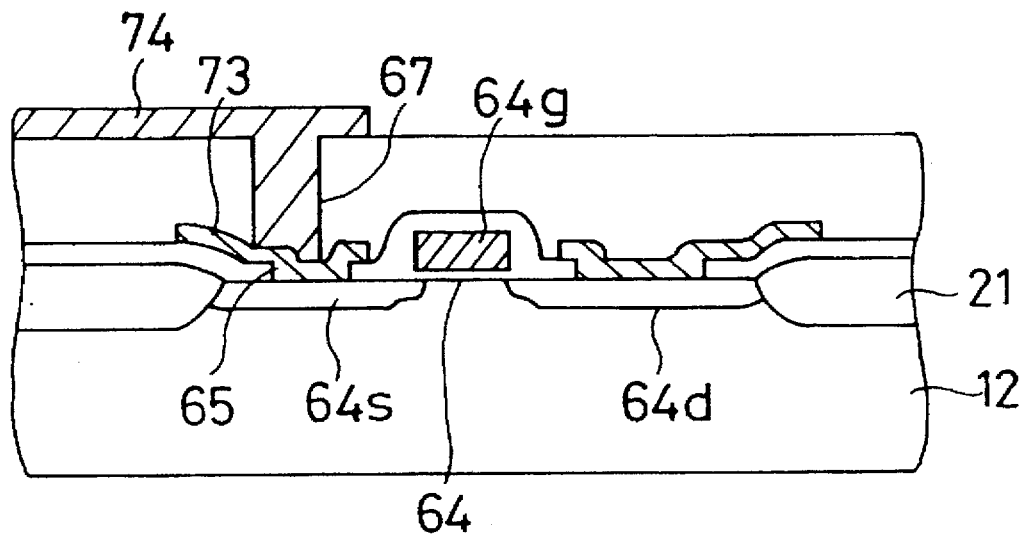
FIG. 12A is a sectional view showing a first principal part of the semiconductor device of the fifth embodiment of the present invention, which is a sectional view of a part taken along a line IV—IV in FIG. 11.

Further, an opening 67 provided in the interlayer insulating film 37 for connecting the source layer 64s of the n-type MOS transistor TR$_8$ to the Vss interconnection 74 may be positioned above the local interconnection 73 as shown in FIG. 10A and FIG. 12A for instance for the purpose of high integration.

Figure 12B:
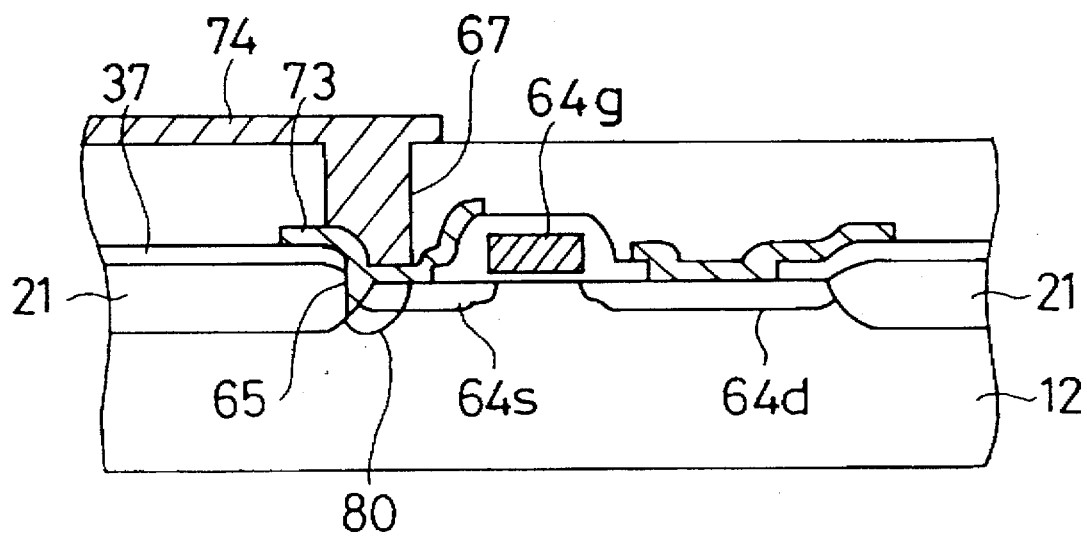
FIG. 12B is a sectional view showing the first principal part of the semiconductor device of the fifth embodiment of the present invention, which is a sectional view of a part taken along a line IV—IV in FIG. 11.

Besides, when it happens that the opening portion 65 formed in the interlayer insulating film 37 for forming the local interconnection 73 comes to the edge portion of the field insulating film 21, and the edge portion is etched thereby to expose the p-type well 12, a leak current flows. Therefore, it is required, after forming the opening portion 65 as shown in FIG. 12B, to introduce impurities through the opening portion 65 and activate the impurities so as to expand the source layer 64s. By doing so, the width of the source layer 64s is reduced and the capacity of the diffused layer is reduced. As a result, the delay time of the operation of the semiconductor element is shortened and the operation speed is increased.

(The sixth embodiment)

Figure 13A:
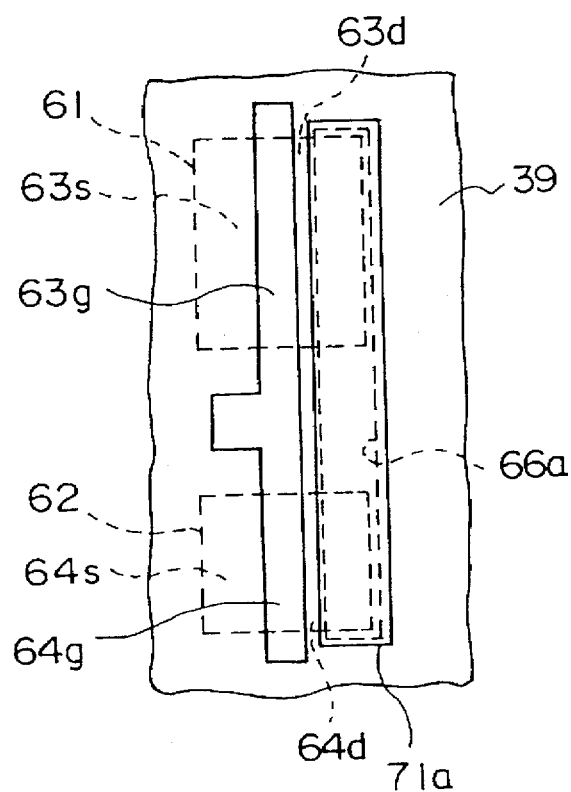
FIGS. 13A and 13B are plan views showing another embodiment of the local interconnection.

When the drain layer 63d of the p-type MOS transistor TR$_7$ and the drain layer 64d of the n-type MOS transistor TR$_8$ shown in the fifth embodiment are connected each other by a local interconnection, it may also be arranged so that an opening portion 66a is formed in a region including two drain layers 63d and 64d and the field insulating layer 21 therebetween in an insulating layer 37 covering the p-type and n-type MOS transistors TR$_7$ and TR$_8$, and a local interconnection (conductive pattern for connection) 71a is formed in the opening portion 66a as shown in FIG. 13A.

Figure 13B:
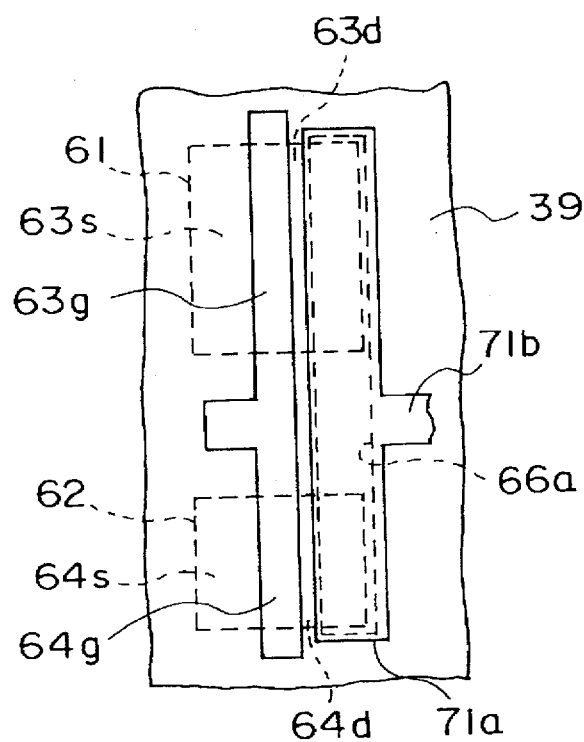

Further, as shown in FIG. 13B, an outgoing portion 71b is formed in the local interconnection 71a, and the outgoing portion 71b may be extended to another opening portion not shown.

(Conclusion)

As described above, according to the present invention, when a diffused layer and an interconnection layer constituting a semiconductor element are connected to each other or when diffused layers are connected to each other, a conductor pattern for connection is formed. The conductor pattern for connection is provided inside one opening portion formed in the region extending from a diffused layer desired to be connected among interlayer insulating films covering the semiconductor element over to the interconnection.

As a result, the thin refractory metal silicide located on the surface of the diffused layer on the side where the conductor pattern for connection is not formed becomes no longer removed by etching when the conductor pattern for connection is formed. Namely, a material of the conductor pattern for connection and a material of the foundation thereof are not limited.

Further, minimum lowering of the integration degree will suffice by limiting the conductor pattern for connection to the neighborhood of the opening portion. Namely, when another interconnection layer is utilized, it is prevented that the interconnection for another function and the conductor pattern for connection collide with each other thereby to lower the integration degree.

The conductor pattern for connection can be used without increasing the process for another purpose such as connection of another conductive layer thereby to achieve an effect if the integration degree is not impeded. Namely, the interconnection density is improved, and the mean interconnection length is reduced without increasing the process, thus advancing to achieve a high speed by using a conductive film constituting the conductor pattern for connection in another local interconnection. Moreover, when the conductor pattern for connection that passes through the inside of the opening portion having a wide contact area is made to extend on the diffused layer, the parasitic resistance of the diffused layer is lowered.

When the conductor pattern for connection of the present invention is applied, it is desirable to use a metal as the material for the conductor pattern for connection since the layer is any of a layer requiring ohmic contact with both p$^+$ and n$^+$ types of semiconductors, a layer in which high temperature processing becomes impossible because of a layer upper than TiSi, or a layer in which the interconnection resistance becomes an issue. Therefore, it is desirable that both the interlayer insulating film and the conductor pattern for connection are thinner as compared with other interconnection layers.

Due to a fact that it is easy to make the layer thinner and to obtain the accuracy of fine working easily, tungsten is excellent as the material. Further, since it is favorable to use fluorine as the principal etchant when tungsten is used, it is advantageous for setting the selectivity high to use an insulating film containing SiO$_2$ as the principal ingredient. However, since approximately 2 is typical as the selectivity, isotropic components become necessary in the etching process of tungsten. This is because of such a reason that, due to the existence of the difference in level of the gate electrode, a metal remains behind easily on the sidewall in anisotropic etching, thus requiring excessive etching in the order of the step height and to increase the film thickness of the insulating film.

According to another invention, when the opening portion is formed, either a sidewall is formed on the side portion of the interconnection and is made to lie upon the edge portion of the diffused layer or the interconnection is made to project on to the diffused layer side in the opening portion. Thus, even when the diffused layer has an LDD construction, the low concentration layer of the LDD construction is protected by the sidewall or the interconnection. Therefore, the conductor pattern for connection does never come into contact with the low concentration layer, and the leak current does not flow to the substrate side. Moreover, since the edge portion of the field oxide film is covered by the foregoing, the edge portion of the field oxide film is removed by etching when the opening portion is formed, and the leak current does no longer flow therefrom. Further, since the interconnection and the diffused layer are formed close to each other, reduction of the cell area progresses.

Furthermore, when the opening portion is formed in the interlayer insulating film, a part of the interlayer insulating film is made to remain on the side portion of the sidewall. Thus, since the thin portion of the field oxide film where the thin refractory metal silicide layer formed on the surface of the thin diffused layer is not formed is protected surely by the sidewall, the junction leakage is reduced.

When an insulating film is made to remain on the side portion of the sidewall in forming these opening portions in the insulating film, the width of the sidewall is widened in the opening portions, and the parts that leak easily are protected surely by the sidewall.

What is claimed is:

1. A semiconductor device comprising:

a first insulating layer formed on a part of a semiconductor substrate;

a plurality of transistors including a first transistor and a second transistor formed in said semiconductor substrate in regions surrounded by said first insulating layer, each of said transistors having a gate electrode extending on said first insulating layer and impurity diffused layers on both sides of gate electrode;

a second insulating layer covering said transistors and said gate electrodes on said first insulating layer;

a first opening portion formed in said second insulating layer, said first opening portion exposing one of said impurity diffused layers of said first transistor and one of said gate electrodes;

a second opening portion formed in said second insulating layer, said second opening portion exposing one of said impurity diffused layers of said second transistor and said one of said gate electrodes;

a first conductive pattern burying said first opening for contacting said impurity diffused layer of said first transistor and said one of said gate electrodes in said first opening portion, said first conductive pattern is separated from other transistors of said plurality of transistors; and a second conductive pattern burying said second opening for contacting said impurity diffused layer of said second transistor and said one of said gate electrodes in said second opening portion, said second conductive pattern is separated from the other transistors of said plurality of transistors.

2. The semiconductor device according to claim 1, wherein a conductive layer is formed in a self-aligned manner on a surface of the impurity diffused layers constituting said plurality of transistors.

3. The semiconductor device according to claim 2, wherein said conductive layer formed in the self-aligned manner is a silicide layer formed by a salicide technique.

4. The semiconductor device according to claim 1, wherein said gate electrodes of said plurality of transistors contain tungsten silicide.

5. The semiconductor device according to claim 1, wherein a conductive layer is formed in a self-aligned manner above said gate electrodes of said plurality of transistors.

6. The semiconductor device according to claim 5, wherein said conductive layer is a silicide layer formed by a salicide technique.

* * * * *